United States Patent
Kimura et al.

(10) Patent No.: US 7,682,224 B2
(45) Date of Patent: Mar. 23, 2010

(54) METHOD OF MACHINING SUBSTRATE

(75) Inventors: Yusuke Kimura, Ota-ku (JP);
Toshiharu Daii, Ota-ku (JP); Takashi Mori, Ota-ku (JP)

(73) Assignee: Disco Corporation, Tokyo (JP)

( * ) Notice: Subject to any disclaimer, the term of this patent is extended or adjusted under 35 U.S.C. 154(b) by 163 days.

(21) Appl. No.: 12/133,143

(22) Filed: Jun. 4, 2008

(65) Prior Publication Data

US 2008/0318497 A1 Dec. 25, 2008

(30) Foreign Application Priority Data

Jun. 19, 2007  (JP) .............................. 2007-160983

(51) Int. Cl.
*B24B 1/00* (2006.01)

(52) U.S. Cl. .............................. 451/41; 451/70; 451/54; 451/63; 451/289; 451/388; 438/959; 438/459; 257/E21.484; 257/E21.237

(58) Field of Classification Search .................. 451/41, 451/70, 54, 57, 63, 285, 287, 289, 388; 438/959, 438/459, 106, 107, 110; 428/354, 356; 257/E21.484, 257/E21.237
See application file for complete search history.

(56) References Cited

U.S. PATENT DOCUMENTS 4,891,334 A * 1/1990 Satoh et al. .................. 438/694
6,890,800 B2 * 5/2005 Takehara et al. ............. 438/126
7,129,110 B1 * 10/2006 Shibata ........................ 438/106
2001/0010945 A1 * 8/2001 Miyazaki ..................... 438/107
2003/0190795 A1 * 10/2003 Kawakami ................... 438/462
2005/0233499 A1 * 10/2005 Okuda et al. ................. 438/118
2008/0032485 A1 * 2/2008 Shimoyama et al. ......... 438/455
2008/0124896 A1 * 5/2008 Codding et al. .............. 438/459

FOREIGN PATENT DOCUMENTS

JP   A 2000-173954   6/2000
JP   A 2003-51473    2/2003

* cited by examiner

*Primary Examiner*—Eileen P. Morgan
(74) *Attorney, Agent, or Firm*—Greer, Burns & Crain, Ltd.

(57) ABSTRACT

A method of machining a wafer is disclosed, in which the wafer is held by sucking its back-side surface directly onto a suction surface of a chuck table, and the tips of protruding electrodes and a resist layer are cut to make them flush with each other (appendant part cutting step). Next, the wafer is held by sucking the surface of the cut appendant part directly onto the suction surface of the chuck table, and the back-side surface of the wafer is ground (back-side surface grinding step), followed by removing the resist layer. The wafer is held onto the chuck table without using any protective tape but by directly holding the wafer, whereby the wafer can be ground to have a uniform thickness.

4 Claims, 11 Drawing Sheets

METHOD OF MACHINING SUBSTRATE

BACKGROUND OF THE INVENTION

1. Field of the Invention

The present invention relates to a method of machining a substrate such as a semiconductor wafer provided at its face-side surface with an appendant part including protruding metals and a resin part, in which the appendant part is cut and the back-side surface of the substrate is ground to make the substrate thinner.

2. Description of the Related Art

The flip flop technology has been known as one of mounting technologies for the purpose of suppressing the volume needed to mount a semiconductor chip onto a wiring substrate or for the purpose of realizing a higher transfer speed of electrical signals. The flip flop technology includes forming protruding electrodes having a height of, for example, about 15 to 100 μm on a surface of a semiconductor chip, and bonding the electrodes directly to electrodes provided on the mounting substrate side. The protruding electrodes are formed by plating or the like method, and, if the plurality of protruding electrodes are nonuniform in height, the comparatively lower-height electrodes may fail to be bonded to the corresponding electrodes on the mating side. This problem becomes more conspicuous as the density of the electrodes arranged on the chip surface becomes higher.

Taking this into account, in order to satisfactorily bond all the protruding electrodes to the mating electrodes, it has been practiced to render the protruding electrodes uniform in height by collectively cutting their tips at the stage of the wafer not yet divided into the semiconductor chips (refer to, for example, Japanese Patent Laid-Open No. 2000-173954). After the cutting on the face side of the wafer is conducted to make the protruding electrodes uniform in height, the wafer is thinned to a desired chip thickness by grinding the back-side surface of the wafer. For grinding the back-side surface of the wafer, there has been known a grinding apparatus for performing infeed grinding in which the wafer is suction held on a vacuum chuck type chuck table, with its back-side surface exposed, and, while the wafer is revolved by rotating the chuck table, a grinding tool such as grindstone is pressed against the back-side surface of the wafer (refer to, for example, Japanese Patent Laid-Open No. 2003-051473).

In forming the protruding electrodes by a plating method, a resist layer is formed on the face side of the wafer, exposure to light is conducted to expose only those portions of chip surfaces at which electrodes are to be formed, and a plating film is deposited on the wafer surface portions exposed by the exposure, i.e., in holes bored in the resist layer, whereby the electrodes are formed. Therefore, at the time of cutting the tips of the protruding electrodes as above-mentioned, the resist layer is also cut simultaneously. Conventionally, the back-side surface grinding for adjusting the wafer thickness to a desired value has been conducted either before the formation of the protruding electrodes or after the removal of the resist layer subsequent to the formation of the electrodes. In the former case, the back-side surface of the wafer is ground before forming the electrode by plating. Therefore, when the desired thickness is comparatively small, warping of the wafer may occur in the step of forming the electrodes by plating after the thinning, or breakage of the wafer may occur in the subsequent step of cutting the tips of the electrodes.

In the latter case, on the other hand, a protective tape is adhered to the face side of the wafer for the purpose of protecting the protruding electrodes (obtained by removing the resist layer) when the face side of the wafer is sucked onto the above-mentioned chuck table or the like. While such a protective tape is also applied for protecting the electronic circuits formed on the face side of the chips in the case of grinding the back-side surface of the wafer before forming the electrodes, in the case of grinding the back-side surface after electrode formation, a protective tape comparatively thick and rich in elasticity is used for effectively damping the machining load exerted by the grindstone at the time of grinding and for preventing the electrodes from being damaged due to contact with the chuck table.

However, when the wafer with such a protective tape adhered to the face side thereof is subjected to the back-side surface grinding by the above-mentioned infeed grinding, the machining load exerted on the wafer increases along the direction from the inner peripheral side toward the outer peripheral side (because the circumferential velocity of the revolving wafer is higher on the outer peripheral side), and, therefore, the protective tape elastically deformed so as to be compressed in thickness under the machining load similarly exerted thereon is more compressed to be thinner on the outer peripheral side. Thus, the machining load tends to be consumed in compressing the protective tape rather than in the intended grinding, and this tendency is more conspicuous on the outer peripheral side; as a result, the wafer having been subjected to the back-side surface grinding would be thinner in an inner peripheral part thereof and thicker on the outer peripheral side. When the wafer is thus nonuniform in thickness, there will be a problem, even though the electrodes are uniform in height for example, that the total thickness of the wafer is nonuniform, i.e., the heights from the back-side surface to the top parts of the protruding electrodes in a single wafer are nonuniform.

SUMMARY OF THE INVENTION

Accordingly, it is an object of the present invention to provide a method of machining a substrate provided at its face-side surface with an appendant part including protruding metals and a resin part, by cutting the appendant part, grinding the back-side surface of the substrate and removing the resin part of the appendant part so as to obtain a substrate in which the protruding metals are protruding on the face side of the substrate, wherein the thickness of the substrate per se and the heights of the protruding metals are made uniform, the total thickness of the substrate is also made uniform and, as a result, an enhanced dimensional accuracy can be achieved.

In accordance with a first aspect of the present invention, there is provided a method of machining a substrate provided at a face-side surface thereof with an appendant part including a protruding metal formed to protrude from the face-side surface, and a resin part surrounding the protruding metal and having a height in excess of the protrusion amount of the protruding metal, the method including: a substrate holding step of holding the substrate by suction in the condition where the back side of the substrate is matched to a suction surface of a suction table; an appendant part cutting step of cutting a surface of the appendant part until the tip of the protruding metal and the resin part become at least flush with each other; a back-side surface grinding step of grinding a back-side surface of the substrate in the condition where the cut appendant part is sucked directly onto the suction surface of the suction table so as to hold the substrate; and a resin part removing step of removing the resin part from the face-side surface of the substrate.

According to the first aspect of the present invention, the surface of the appendant part cut in the appendant part cutting step in the beginning is in the condition where top parts of the protruding metals are exposed and their surroundings are filled with the resin part, and the protruding metals and the resin part are flush with each other, i.e., the appendant part surface is machined to be flat. Since the back-side surface of the substrate is sucked directly onto the suction surface of the suction table without any protective tape or the like therebetween, the thickness of the appendant part can adequately be brought to the desired height by cutting, without being influenced by a protective tape or the like. Therefore, at this stage, the protruding metals can be made uniform in height.

In the next back-side surface grinding step, the surface of the appendant part machined to be flat is sucked directly onto the suction surface of the suction table to hold the substrate, and the back-side surface of the substrate is ground. Here, since the surface of the appendant part is sucked directly onto the suction surface of the suction table without any protective tape or the like therebetween, the thickness of the substrate can be adequately ground to the desired height, without being influenced by a protective tape or the like; therefore, the thickness of the substrate can be made uniform. In the back-side surface grinding step, though the protruding metals make contact with the suction surface of the suction table, the surrounding resin part also makes contact with the suction surface, so that the machining load during the grinding is dispersed to the resin part side. This ensures that the top parts of the protruding metals can be restrained from being damaged. When the resin part of the appendant part is removed in the final resin part removing step, a substrate can be obtained in which the protruding metals being uniform in height are protruding on the face side of the substrate which is uniform in thickness. Naturally, the total thickness of the substrate is uniform.

In accordance with a second aspect of the present invention, there is provided a method of machining a substrate provided at a face-side surface thereof with an appendant part including a protruding metal formed to protrude from the face-side surface, and a resin part surrounding the protruding metal and having a height in excess of the protrusion amount of the protruding metal, the method including: a substrate holding step of holding the substrate by suction in the condition where the back side of the substrate is matched to a suction surface of a suction table; a first appendant part cutting step of cutting only a surface of the resin part of the appendant part in such a range as not to reach the protruding metal; a back-side surface grinding step of grinding a back-side surface of the substrate in the condition where the cut resin part is sucked directly onto the suction surface of the suction table; a second appendant part cutting step of holding the substrate in the condition where the back-side surface of the substrate is sucked directly onto the suction surface of the suction table, and simultaneously cutting the protruding metal and the resin part until the tip of the protruding metal and the resin part become at least flush with each other; and a resin part removing step of removing the resin part from the face-side surface of the substrate.

In the second aspect of the present invention, a machining method is provided which is the same as that of the first-named invention, except that the appendant part cutting step is divided into the first appendant part cutting step of cutting only the surface of the resin part of the appendant part in such a range as not to reach the protruding metals, and the second appendant part cutting step of simultaneously cutting the protruding metals and the resin part until the tips of the protruding metals and the resin part become at least flush with each other. In the back-side surface grinding step, only the resin part of the appendant part cut in the first appendant part cutting step is sucked onto the suction table, so that the protruding metals are in the state of being protected by the resin part and, hence, do not make contact with the suction table. Therefore, there is no risk of damaging or staining the protruding metals at the time of grinding the back-side surface. The appendant part is cut to the desired thickness in the second appendant part cutting step, and the resin part is removed in the final resin part removing step, to obtain a substrate in which the protruding metals are protruding from the face-side surface of the substrate. According to this invention, the back-side surface of the substrate and the surface of the appendant part are sucked directly onto the suction surface of the suction table without any protective tape or the like therebetween in the relevant steps, so that the height of the appendant part and the thickness of the substrate can adequately be brought to the respective desired values by cutting. Therefore, it is possible to obtain a substrate in which the thickness of the substrate and the height of the protruding metals are uniform, and which has a uniform total thickness.

In each of the first and second aspects of the present invention, preferably, the face-side surface of the substrate is provided with a device formation region and an outer peripheral marginal region surrounding the device formation region. Also, preferably, only that region of the back-side surface which corresponds to the device formation region is ground in the back-side surface grinding step. This mode ensures that the substrate obtained upon the grinding of the back-side surface has been thinned only in the device formation region, and the outer peripheral marginal region surrounding the device formation region is left in the original thickness so as to form an annular projected part. The annular projected part secures the rigidity of the substrate, promises easy handleability of the substrate thinned upon the grinding of the back-side surface, and prevents the substrate from being damaged.

According to the present invention, in the process in which a substrate provided at its face-side surface with an appendant part including protruding metals and a resin part is subjected to cutting of the appendant part, grinding of the back-side surface of the substrate, and removal of the resin part of the appendant part to obtain a substrate having the protruding metals protruding from the face-side surface of the substrate, the thickness of the substrate per se and the height of the protruding metals can be made uniform, the total thickness of the substrate can be made uniform and, as a result, an enhanced dimensional accuracy can be achieved.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Now, an embodiment of the present invention will be described below referring to the drawings.

[1] Semiconductor Wafer (Substrate)

Figure 1A:
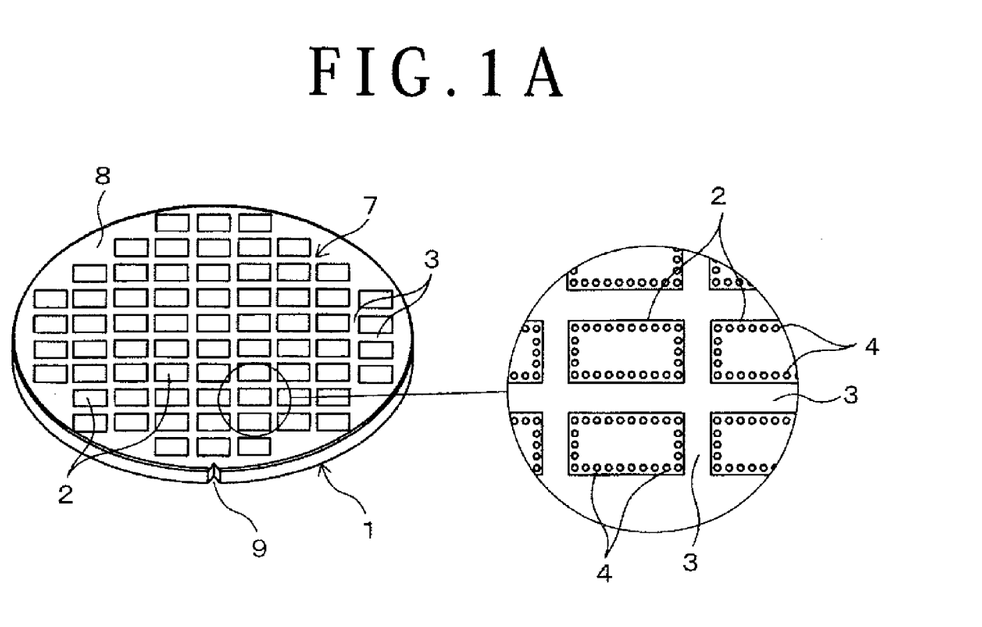
FIG. 1A is a perspective view of a wafer subjected to cutting and grinding in an embodiment of the present invention.

FIG. 1A shows a circular disk-shaped semiconductor wafer to which thinning by cutting on the face side and grinding on the back side according to this embodiment is to be applied. The wafer 1 is a silicon wafer or the like, of which the thickness before machining is about 700 µm, for example. The wafer 1 is provided at its face-side surface with a plurality of semiconductor chips 2. The semiconductor chips 2 are configured by electronic circuits (not shown) such as ICs and LSIs formed on the surfaces in rectangular regions demarcated in a grid pattern by planned dividing lines 3.

Each of the semiconductor chips 2 is formed with a plurality of protruding electrodes 4 protruding from the surface thereof, as shown in the enlarged view on the right side in FIG. 1A. The electrodes 4 are formed by a plating method in which a resist layer (resin part) 5 is formed on the surface of the wafer 1 by spin coating or the like, then only those parts of the resist layer 5 at which the electrodes 4 are to be formed are exposed to light, and plating is formed in the exposed chip surface parts, i.e., in the holes bored in the resist layer. The resist layer 5 is formed in the state of surrounding all the electrodes 4 and covering substantially the whole part of the surface of the wafer 1 other than the electrodes 4.

Figure 2:
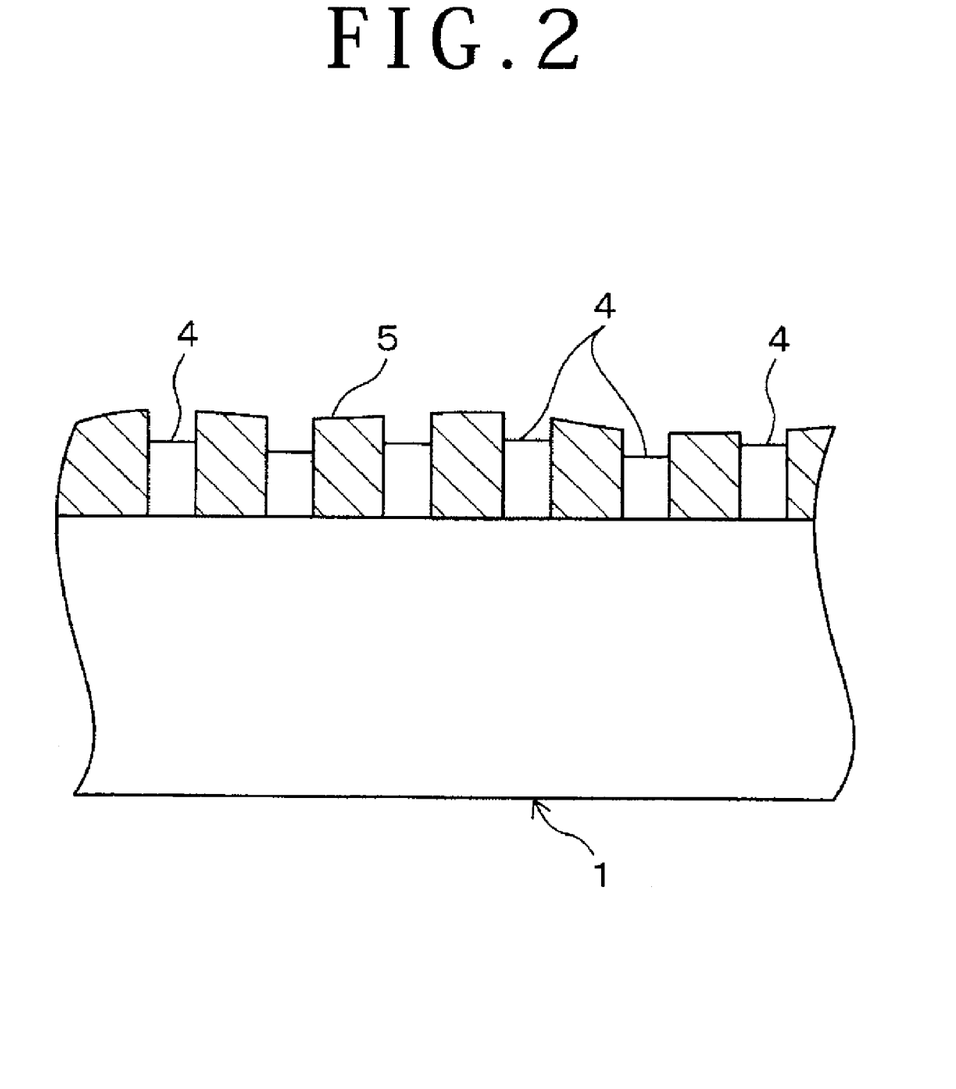
FIG. 2 is an enlarged sectional view of the face-side surface of a wafer before machining.

In this case, as shown in FIG. 2, the electrodes 4 and the resist layer 5 are different in height from the surface of the wafer 1, specifically, the resist layer 5 is larger in height than all the electrodes 4, as shown in FIG. 2. The surface of the resist layer 5 is not flat, and the electrodes 4 composed of the as-formed plating are nonuniform in height. Incidentally, in this embodiment, the electrodes 4 and the resist layer 5 constitute an appendant part 6 in the present invention.

The semiconductor chips 2 are formed in a device formation region 7 which is substantially the whole area of the face-side surface of the wafer 1, and an outer peripheral part of the wafer 1 is an annular outer peripheral marginal region 8 where no semiconductor chip 2 is formed. In addition, the circumferential surface of the wafer 1 is formed at a predetermined position with a V-shaped notch 9 indicative of the crystal orientation of the semiconductor. The wafer 1, finally, is cut and divided along the planned dividing lines 3 into a plurality of individual semiconductor chips 2.

On the semiconductor chips 2 after the division into the individual chips, the electrodes 4 are mounted, for example, in the state of being bonded directly to electrodes of a mounting substrate by a mounting technology such as flip chip. For this mounting, the electrodes 4 have to be uniform in height, and their top parts have to be aligned. In addition, the wafer 1 is thinned to a uniform thickness by grinding its back-side surface until the desired thickness of the semiconductor chips 2 is attained. Now, an embodiment of the present invention including a step of cutting the appendant part 6 to adjust the heights of the electrodes 4 to the desired height and a step of grinding the back-side surface of the wafer 1 will be described below.

[2] Method of Machining Wafer in First Embodiment

[2-1] Appendant Part Cutting Step

Figure 1B:
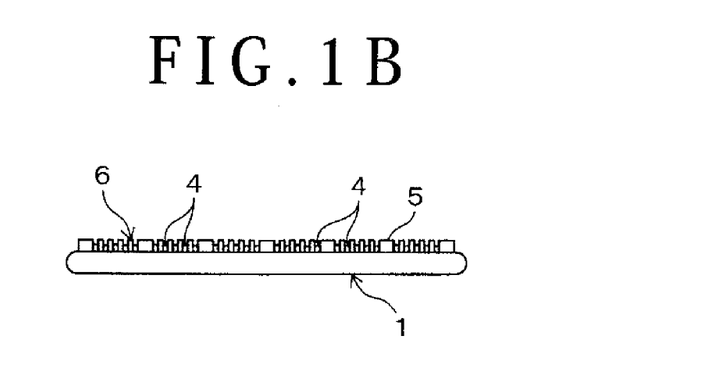
FIG. 1B is a side view of the same.
Figure 3A:
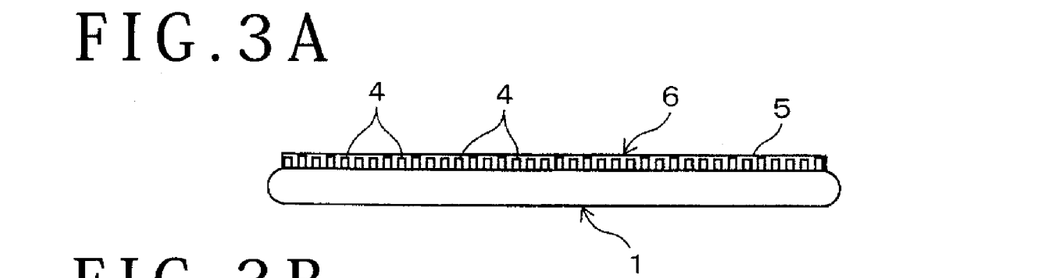
FIGS. 3A to 3D illustrate a machining method according to a first embodiment of the present invention, in the order of steps.

FIG. 3A shows a wafer 1 similar to that shown in FIGS. 1A and 1B. First, a cutting step is carried out to cut the surface of the appendant part 6 of the wafer 1 to uniformly adjust the height of the electrodes 4. In this case, the appendant part 6 to be cut is tip parts of all the electrodes 4 and the resist layer 5, and the cutting is conducted until they become flush with each other and the electrodes 4 come to have the desired height.

Figure 3B:
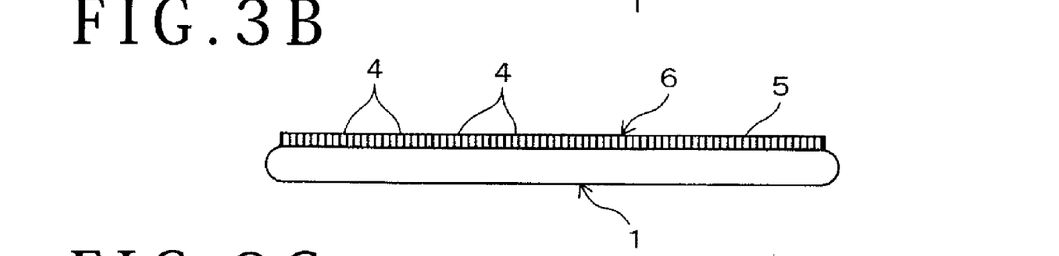
Figure 4:
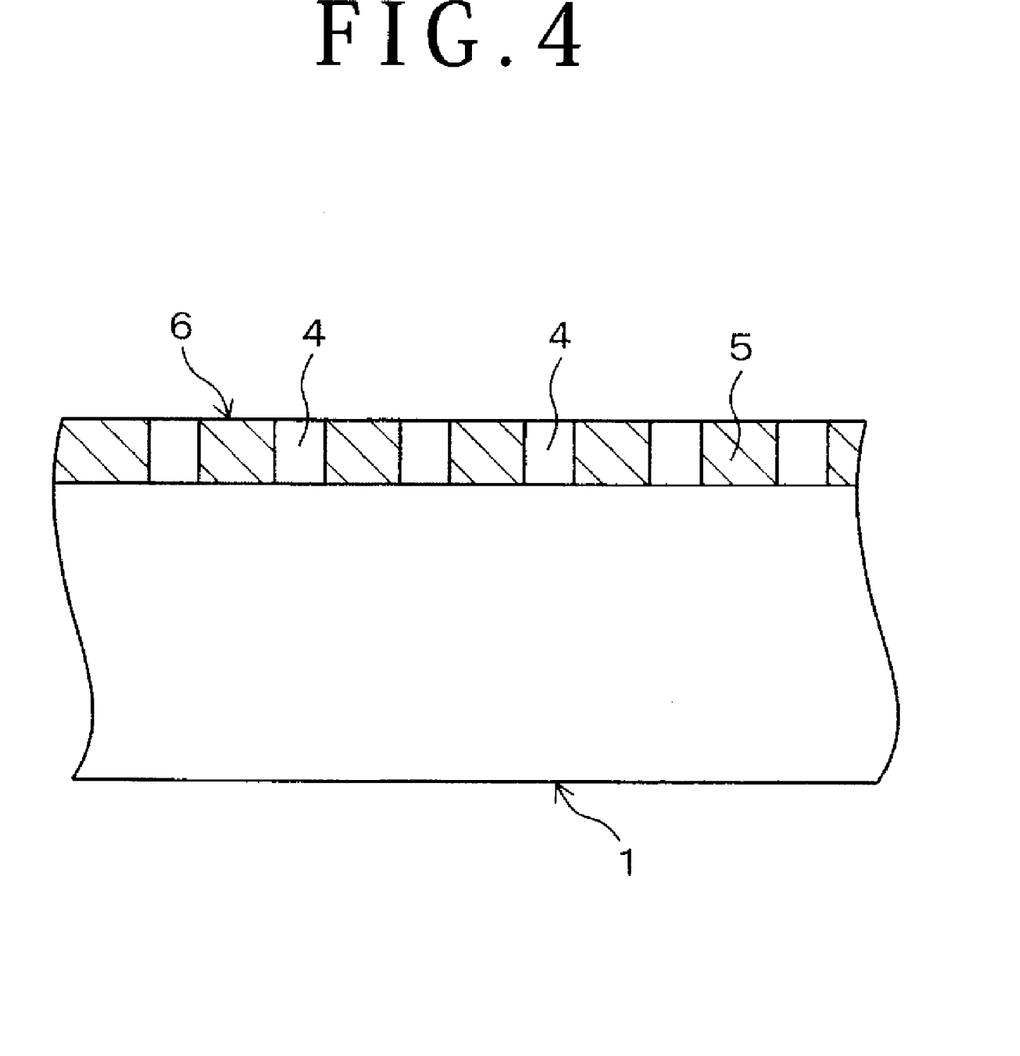
FIG. 4 is an enlarged sectional view of the face-side surface of the wafer after an appendant part cutting step in the first embodiment.
Figure 5:
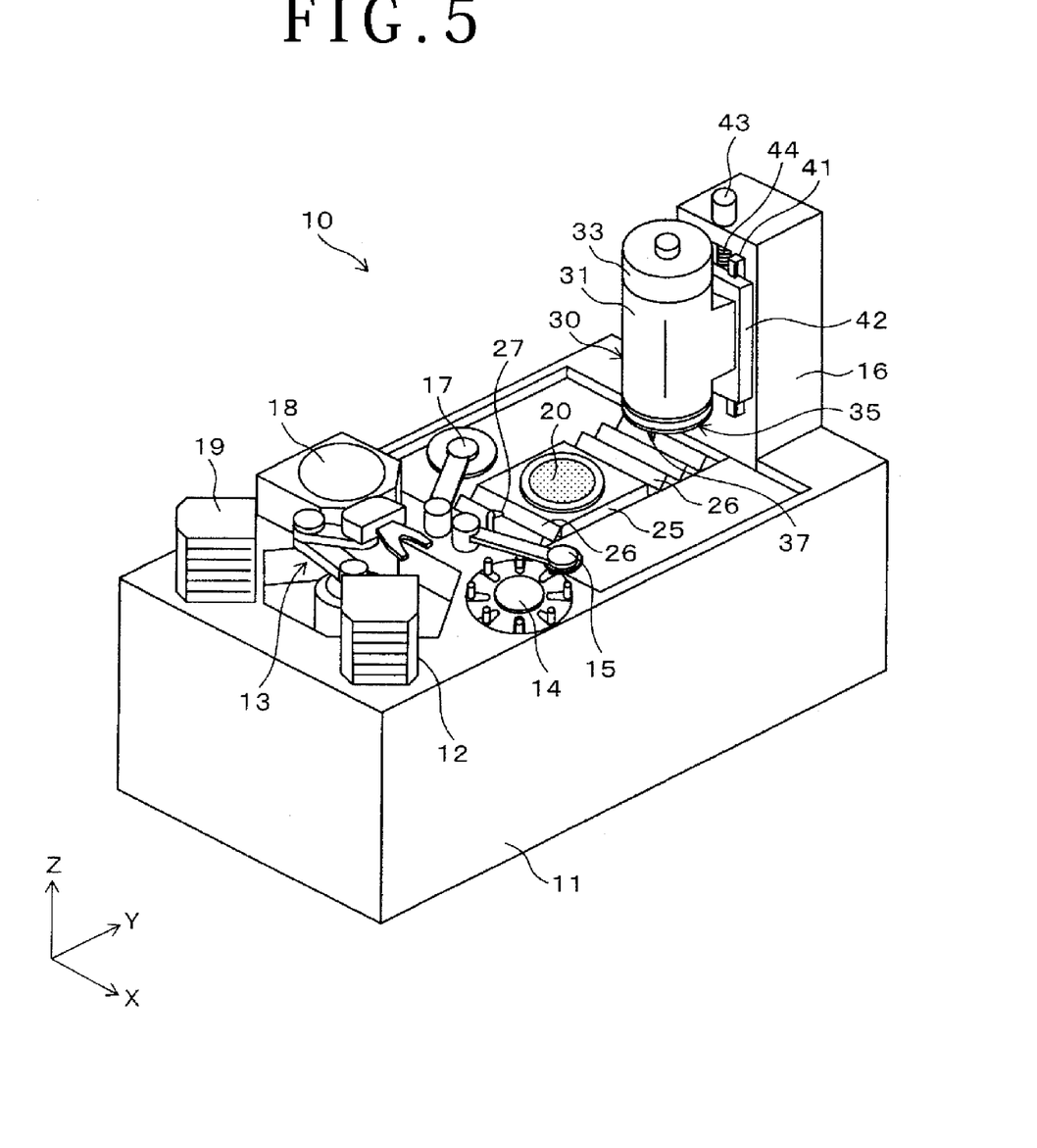
FIG. 5 is a perspective view of a cutting apparatus by which the appendant part cutting step is carried out preferably.

For the cutting, a cutting apparatus 10 shown in FIG. 5 is used preferably. According to the cutting apparatus 10, the back-side surface of the wafer 1 is sucked directly onto a suction surface of a vacuum chuck type chuck table (suction table) 20 to hold the wafer 1, and a tool 37 of a cutting unit 30 being rotated is pressed against the appendant part 6, whereby the surface of the appendant part 6 is cut. FIG. 3B shows the wafer 1 in the state in the condition after the cutting of the appendant part 6; in the surface of the appendant part 6 of the wafer 1, the electrodes 4 and the resist layer 5 are flush with each other and the electrodes 4 are uniform in height, as shown in FIG. 4.

[2-1-1] Cutting Apparatus

Here, the configuration and operation of the cutting apparatus 10 shown in FIG. 5 will be described. The cutting apparatus 10 has a rectangular parallelopiped base 11, and a plurality of wafers 1 are laminated and stored in a supply cassette 12 detachably attached to a predetermined portion on the base 11, in such a manner that the face side of each wafer 1 on which the appendant part 6 is formed is directed up. A single wafer 1 is drawn out of the supply cassette 12 by a feeding robot 13, the wafer 1 is mounted on a positioning table 14 with its face side up, and is positioned into a predetermined position.

Figure 6:
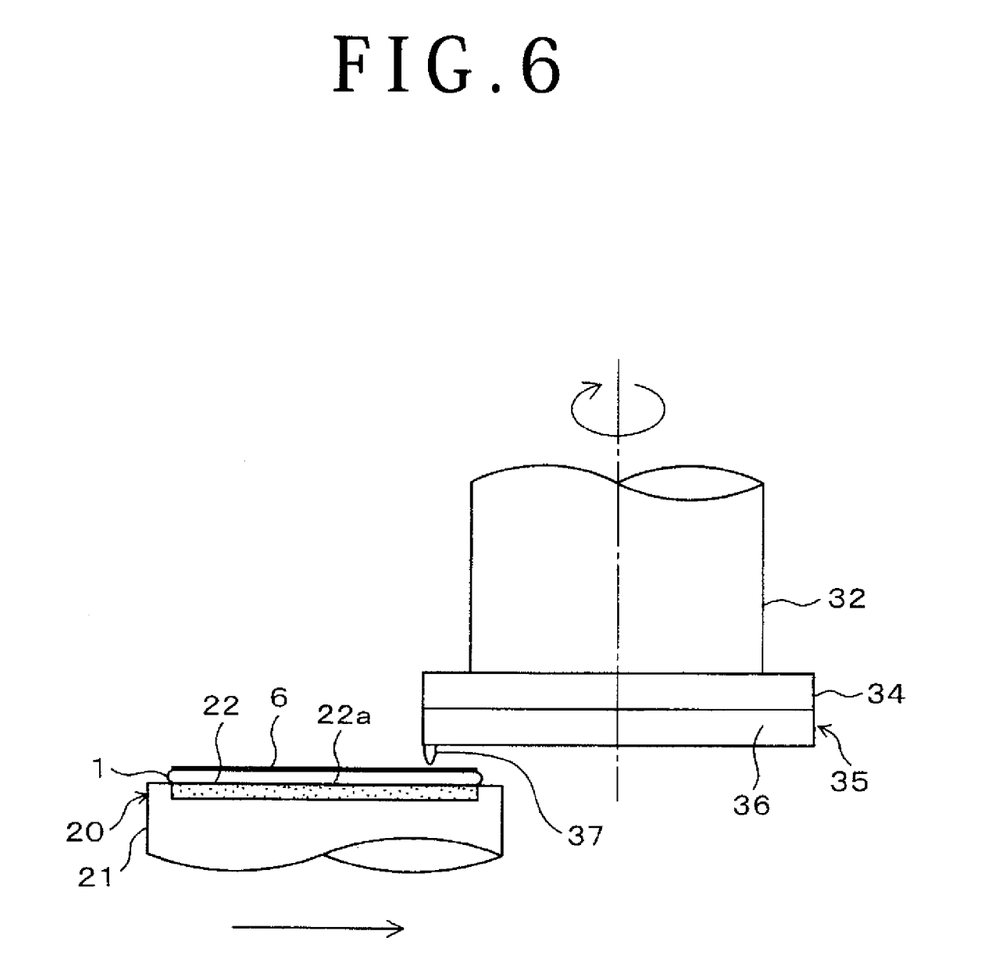
FIG. 6 is a side view showing the condition in which the face-side surface of the wafer is cut by a cutting unit of the cutting apparatus.

The wafer 1 positioned on the positioning table 14 is picked up from the positioning table 14 by a supplying arm 15, and is mounted on a disk-shaped chuck table 20 in vacuum operation, concentrically and with its back side down. As shown in FIG. 6, the chuck table 20 has a configuration in which a circular suction part 22 composed of a porous member is formed at a central upper part of a frame 21, and the wafer 1 is sucked and held in the condition in which its back-side surface makes direct contact with a suction surface 22a, i.e., the upper surface of the suction part 22 and the surface of the appendant part 6 is exposed.

As shown in FIG. 5, the chuck table 20 is supported on a table base 25 provided to be movable in Y direction on the base 11, and the wafer 1 is fed into a machining position on the depth side in the Y direction through the table base 25 and the chuck table 20. On the upper side of the machining direction is disposed a cutting unit 30 for cutting the appendant part 6. On the base 11, a bellows-like cover 26 for covering a moving path of the table base 25 to prevent cutting chips or the like from dropping into the base 11 is provided in a contractable and expandable manner.

The cutting unit 30 is disposed to be lifted up and down along the Z direction (vertical direction), on the front side of a column 16 provided erecting on an end part on the depth side of the base 11. Specifically, guides 41 extending in the Z direction are provided on the front surface of the column 16, and the cutting unit 30 is slidably mounted to the guides 41 through a slider 42. The cutting unit 30 is lifted up and down along the Z direction through the slider 42, under the function of a ball screw type feeding mechanism 44 driven by a servo motor 43.

The cutting unit 30 has a configuration in which a spindle shaft 32 shown in FIG. 6 is coaxially and rotatably supported in a cylindrical spindle housing 31 having an axis extending in the Z direction, and the spindle shaft 32 is driven to rotate by a spindle motor 33 fixed to an upper end part of the spindle housing 31. As shown in FIG. 6, a cutting tool 35 having a tool 37 attached to the lower surface of an annular frame 36 is attached to the lower end of the spindle shaft 32 through a circular disk-shaped flange 34. The tool 37 has an edge part of diamond or the like attached to the tip thereof, and is fixed to the lower surface of an outer peripheral part of the frame 36, with its edge part directed downward. The cutting tool 35 is rotated as one body with the spindle shaft 32, and the outer diameter of cutting of the tool 37 rotated is set to be larger than the diameter of the wafer 1.

In cutting the appendant part 6 of the wafer 1, the cutting unit 30 is lowered by the feeding mechanism 44 to such a position that the height of the cutting edge of the tool 37 is brought to a height for cutting the surface of the appendant part (in this case, the electrodes 4 and the resist layer 5) 6 of the wafer 1 by a predetermined amount, and, further, the cutting tool 35 is put into rotation by the spindle motor 33. Then, the table base 25 is moved toward the depth side, thereby gradually moving the wafer 1 toward the machining position under the cutting unit 30. As a result, the surface of the appendant part 6 is gradually cut by the tool 37 of the cutting tool 35, and, with the wafer 1 moved until covered by the frame 36, the whole area of the surface of the appendant part 6 is cut to be flat.

When the whole surface of the appendant part 6 is cut, the cutting unit 30 is moved upward to retreat from the wafer 1, and, on the other hand, the table base 25 is moved to the viewer's side, whereby the wafer 1 is returned into the mounting/dismounting position where the wafer 1 has been mounted from the supplying arm 15 onto the chuck table 20. At the mounting/dismounting position, the vacuum operation of the chuck table 20 is stopped. Then, the wafer 1 is fed by a recovery arm 17 to a spinner type washing device 18, where it is washed and dried, and thereafter it is fed by the feeding robot 13, to be contained into a recovery cassette 19. In addition, the chuck table 20 from which the wafer 1 has been removed is cleared of cutting chips or the like by air jetted from an air nozzle 27.

[2-2] Back-Side Surface Grinding Step

Figure 3C:
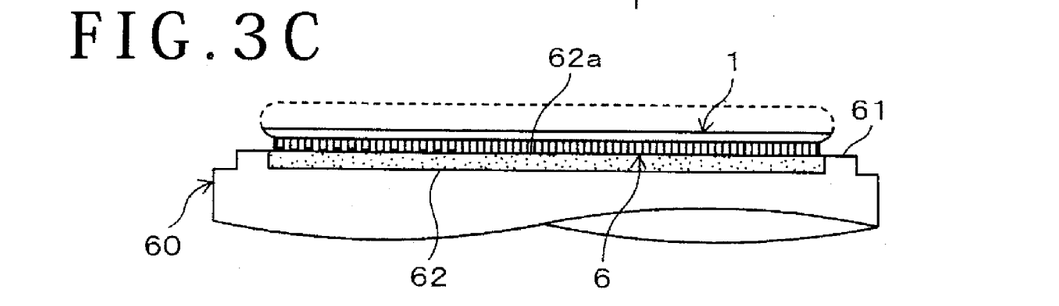
Figure 7:
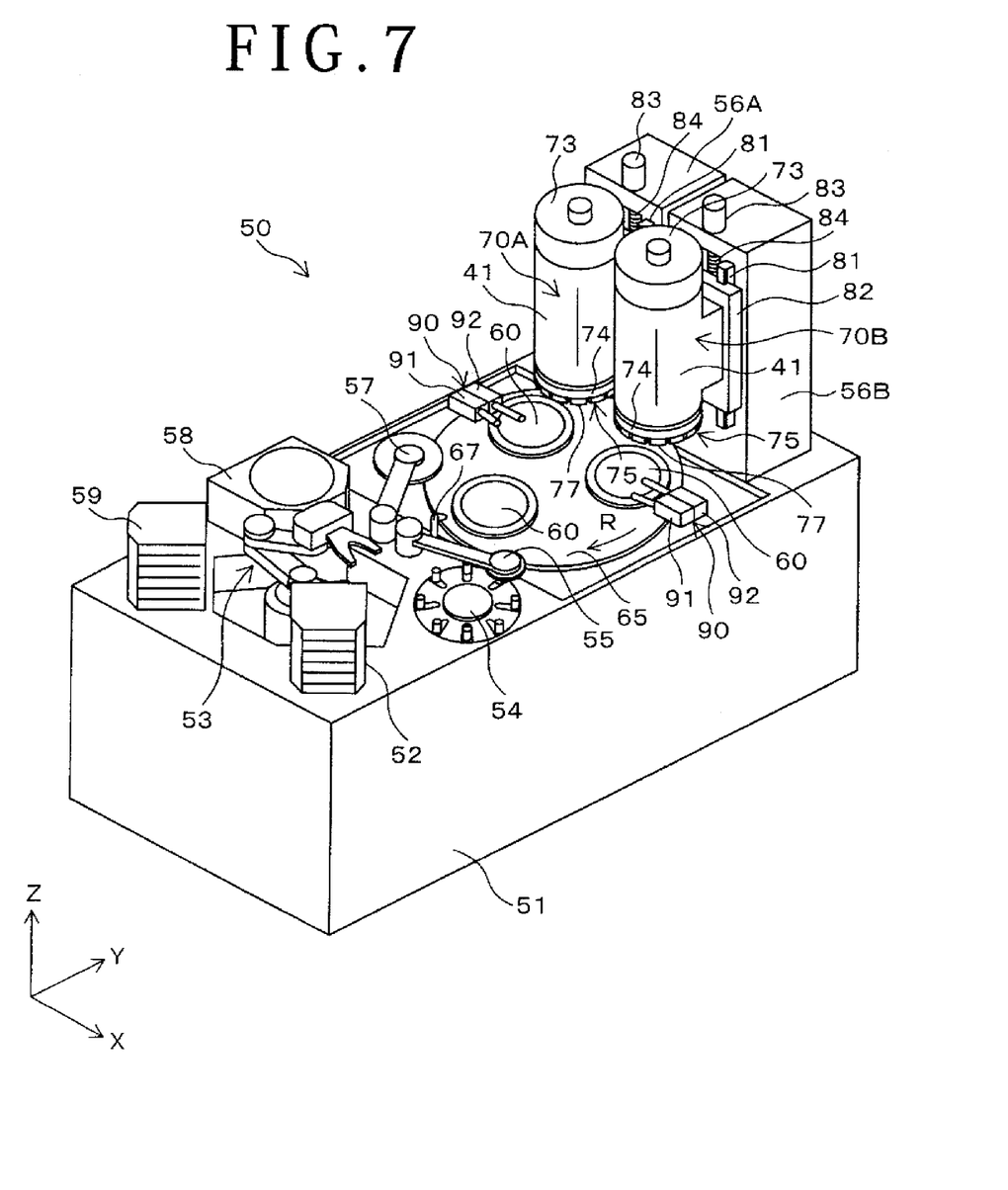
FIG. 7 is a perspective view of a grinding apparatus by which a back-side surface grinding step is carried out preferably.

The wafer 1 with the appendant part 6 having been cut as above-mentioned is then subjected to the machining for thinning to a desired thickness by grinding the back-side surface thereof. For the back-side surface grinding, a grinding apparatus 50 for performing infeed grinding shown in FIG. 7 is used preferably. According to the grinding apparatus 50, the surface of the cut appendant part 6 is sucked directly onto a suction surface of a vacuum chuck type chuck table (suction table) 60 to hold the wafer 1, and rough grinding and finish grinding are applied to the back-side surface of the wafer 1 by two grinding units (for rough grinding and finish grinding) 70A, 70B. FIG. 3C shows the condition where the back-side surface of the wafer 1 held on the chuck table 60 has been ground.

[2-2-1] Grinding Apparatus

Here, the configuration and operation of the grinding apparatus 50 will be described. The grinding apparatus 50 has a rectangular parallelopiped base 51, and a plurality of wafers 1 are laminated and stored in a supply cassette 52 detachably attached to a predetermined portion on the base 51, with the back side of each wafer 1 up. A single wafer 1 is drawn out of the supply cassette 51 by a feeding robot 53, the wafer 1 is mounted on a positioning table 54, with its back side up, and is positioned into a predetermined position.

On the base 51 is provided a turntable 65 which is driven to rotate in R direction, and a plurality of (in this case, three) circular disk-like chuck table 60 are disposed in an outer peripheral area of the turntable 65 at regular intervals along the circumferential direction. The chuck tables 60 are rotatably supported, and are each rotated in one direction or in both directions by a rotational driving mechanism (not shown).

The wafer 1 positioned on the positioning table 54 is picked up from the positioning table 54 by a supplying arm 55, and is mounted onto one chuck table 60 being in vacuum operation, concentrically and in such a condition that its face side on which the appendant part 6 is formed is directed downward. As shown in FIG. 3C, the chuck table 60 has a configuration in which a circular suction part 62 composed of a porous member is formed at a central upper part of a frame 61, and the wafer 1 is sucked and held in a condition in which the surface of the appendant part 6 makes direct contact with a suction surface 62a, i.e., the upper surface of the suction part 62 and its back-side surface is exposed.

With the turntable 65 rotated by a predetermined angle in the R direction, the wafer 1 held on the chuck table 60 is fed into a primary machining position under the grinding unit 70A for rough grinding, where the back-side surface of the wafer 1 is roughly ground by the grinding unit 70A. Next, with the turntable 65 rotated again by a predetermined angle in the R direction, the wafer 1 is fed into a secondary machining position under the grinding unit 70B for finish grinding, where the back-side surface of the wafer 1 is subjected to finish grinding by the grinding unit 70B.

Two columns 56A, 56B arrayed in X direction are provided erecting on an end part on the depth side of the base 51, and the grinding units 70A and 70B are disposed on the front surfaces of the columns 56A and 56B so that they can be lifted up and down along the Z direction (vertical direction). The lift structures are the same as that in the case of the cutting unit 30; specifically, the grinding units 70A, 70B are slidably mounted through sliders 82 to guides 81 which are provided on the front surfaces of the columns 56A, 56B and extending in the Z direction. The grinding unit 70A, 70B are each lifted up and down in the Z direction through the slider 82, under the function of a ball screw type feeding mechanism 84 driven by a servo motor 83.

The grinding unit 70A and 70B are the same in essential configuration, and are distinguished from each other in terms of whether the grindstone mounted thereon is for rough grinding or for finish grinding. The grinding units 70A, 70B each have a cylindrical spindle housing 41 with an axis extending in the Z direction, and a spindle shaft (not shown) driven to rotate by a spindle motor 73 is supported in the spindle housing 41. In addition, a grinding wheel 75 is attached to the lower end of the spindle shaft through a flange 74.

The grinding wheel 75 has a structure in which a plurality of grindstones 77 are arrayed and attached to the lower surface of an annular frame (not shown). The lower surface serving as a machining surface of each grindstone 77 is set to be orthogonal to the axial direction of the spindle shaft. The grindstone 77 is, for example, a grindstone obtained by mixing diamond abrasive grains in a vitreous bonding material, molding the mixture, and sintering the molded body.

The grindstone 77 mounted to the grinding unit 70A for rough grinding is, for example, a grindstone which contains comparatively coarse abrasive grains of about #320 to #400. On the other hand, the grindstone 77 mounted to the grinding unit 70B for finish grinding is, for example, a grindstone containing comparatively finer abrasive grains of about #2000 to #8000. The grinding units 70A, 70B are each equipped with a grinding water supply mechanism (not shown) for supplying grinding water for cooling and lubricating the grinding surface or for discharging the grinding chips.

The grinding wheel 75 is rotated as one body with the spindle shaft, and the outer diameter of grinding of the grindstones 77 rotated is set to be larger than the diameter of the wafer 1. In addition, the machining position of the wafer 1 determined by rotating the turntable 65 by a predetermined angle is set at such a position that the cutting edge, i.e., the lower surface of each grindstone 77 passes through the center of rotation of the wafer 1 and that the rotation of the chuck table 60 causes the whole area of the back-side surface of the wafer 1 being revolved to be ground.

The wafer 1 is subjected to grinding of the back-side surface thereof by the grinding units 70A and 70B at the machining positions for rough grinding and finish grinding, respectively. The grinding of the back-side surface is conducted by a method in which the chuck table 60 is rotated to rotate the wafer 1, and, while feeding the grinding unit 70A (70B) downward by a feeding mechanism 84, the grindstones 77 of the grinding wheel 75 being rotated are pressed against the exposed back-side surface of the wafer 1. Here, while the wafer 1 is thinned to the desired thickness, the measurement of the thickness is conducted by use of thickness measuring gauges 90 provided in the vicinity of the machining positions.

Each thickness measuring gauge 90 has a combination of a reference-side height gauge 91 having a probe brought into contact with the upper surface of the frame 61 of the chuck table 60 and a movable-side height gauge 92 having a probe brought into contact with the work surface (in this case, the back-side surface of the wafer 1). The thickness of the wafer 1 of which the back-side surface is being ground is successively measured by comparing the height values measured by both the height gauges 91, 92. The grinding of the back-side surface of the wafer 1 is conducted while measuring the thickness of the wafer 1 by the thickness measuring gauge 90, and the feed amount of the grinding wheel 75 fed by the feeding mechanism 84 is controlled based on the measured thickness value. Incidentally, the rough grinding is conducted until the thickness of the wafer 1 reaches a value greater by, for example, 20 to 40 µm than the desired thickness to be obtained after finish grinding, and the rest of grinding is conducted by the finish grinding.

When the wafer 1 is thinned to the desired thickness through the rough grinding and the finish grinding, recovery of the wafer 1 is started as follows. First, the finish grinding unit 70B is moved upward to retreat from the wafer 1, and, on the other hand, the turntable 65 is rotated by a predetermined angle in the R direction, whereby the wafer 1 is returned into the mounting/dismounting position where the wafer 1 has been mounted from the supplying arm 55 onto the chuck table 60. At the mounting/dismounting position, the vacuum operation of the chuck table 60 is stopped. Then, the wafer 1 is fed by a recovery arm 57 to a spinner type washing device 58, where it is washed and dried, and thereafter it is fed by a feeding robot 53, to be contained into a recovery cassette 59. In addition, the chuck table 60 from which the wafer 1 has been removed is cleared of cutting chips and the like by air jetted from an air nozzle 67.

[2-3] Resist Layer Removing Step

Figure 3D:
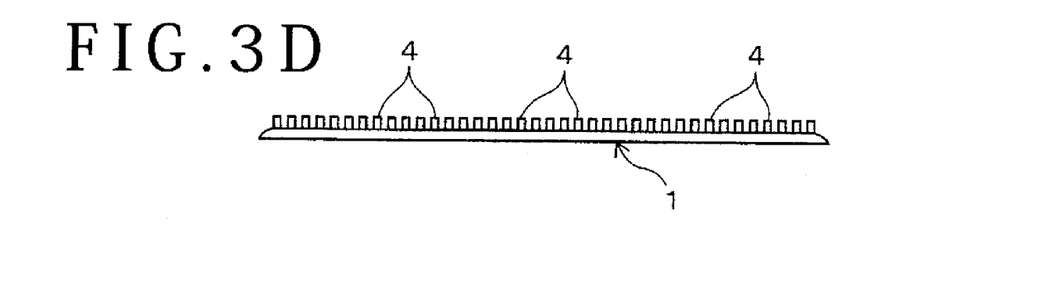

When the appendant part cutting step and the back-side surface grinding step are finished, the resist layer 5 is then removed by such means as etching, to obtain a wafer 1 with the plurality of electrodes 4 formed at the face-side surface thereof, as shown in FIG. 3D.

The method of machining a wafer according to the first embodiment is as above-described. According to this method, the surface of the appendant part 6 cut in the appendant part cutting step is in the condition where the top parts of the electrodes 4 are exposed and their surroundings are filled with the resist layer 5, and the electrodes 4 and the resist layer 5 are cut to be flush with each other, so that the surface of the appendant part 6 has been machined to be flat. In the appendant part cutting step, the back-side surface of the wafer 1 is sucked directly onto the suction surface 22a of the chuck table 20 in the cutting apparatus 10 without any protective tape or the like therebetween, so that the thickness of the appendant part 6 is adequately brought to the desired height by cutting, without being influenced by a protective tape or the like. Therefore, at this stage, the plurality of electrodes 4 can be adjusted to be uniform in height.

In the next back-side surface grinding step, the surface of the appendant part 6 machined to be flat is sucked directly onto the suction surface 62a of the chuck table 60 in the grinding apparatus 50 to hold the wafer 1, and the back-side surface of the wafer 1 is ground. Here, since the surface of the appendant part 6 is sucked directly onto the suction surface of the chuck table 60 without any protective tape or the like therebetween, so that the thickness of the wafer 1 can be adequately brought to the desired height by grinding, without being influenced by a protective tape or the like. Therefore, the wafer 1 can be made uniform in thickness.

In the back-side surface grinding step, though the electrodes 4 make contact with the suction surface 62a of the chuck table 60, the surrounding resist layer 5 also makes contact with the suction surface 62a in the same manner, so that the machining load received from each of the grinding units 70A, 70B is dispersed to the resist layer 5 side. Therefore, the top parts of the electrodes 4 can be restrained from being damaged. When the resist layer 5 is removed by the final resist layer removing step, a wafer in which a plurality of electrodes 4 being uniform in height are protruding on the face side of the wafer 1 being uniform in thickness can be obtained, and the total thickness (wafer 1+electrode 4), naturally, is uniform.

[3] Method of Machining Wafer in Second Embodiment

Now, a method of machining a wafer according to a second embodiment of the present invention will be described below referring to FIG. 8. In the second embodiment, an appendant part cutting step is divided into a first appendant part cutting step of cutting only the surface of a resist layer 5 of an appendant part 6 in such a range as not to reach electrodes 4, and a second appendant part cutting step of cutting both the tips of the electrodes 4 and the resist layer 5 to make them flush with each other. Besides, a back-side surface grinding step is carried out between the first cutting step and the second cutting step. In conducting the cutting and the grinding, the above-mentioned cutting apparatus 10 and grinding apparatus 50 are used.

[3-1] First Appendant Part Cutting Step

Figure 8A:
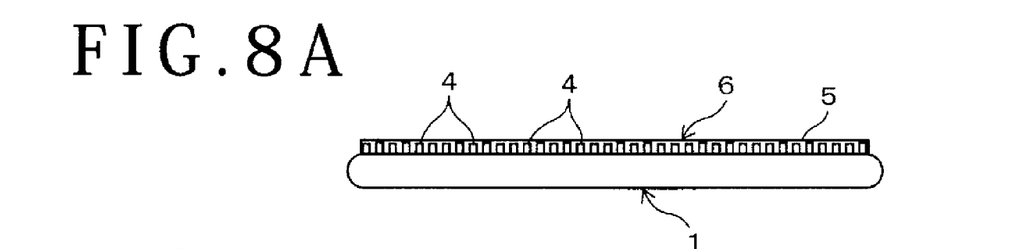
FIGS. 8A to 8E illustrate a machining method according to a second embodiment of the present invention, in the order of steps.
Figure 8B:
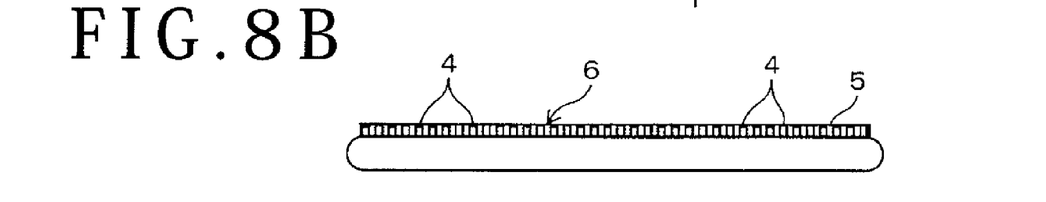
Figure 9:
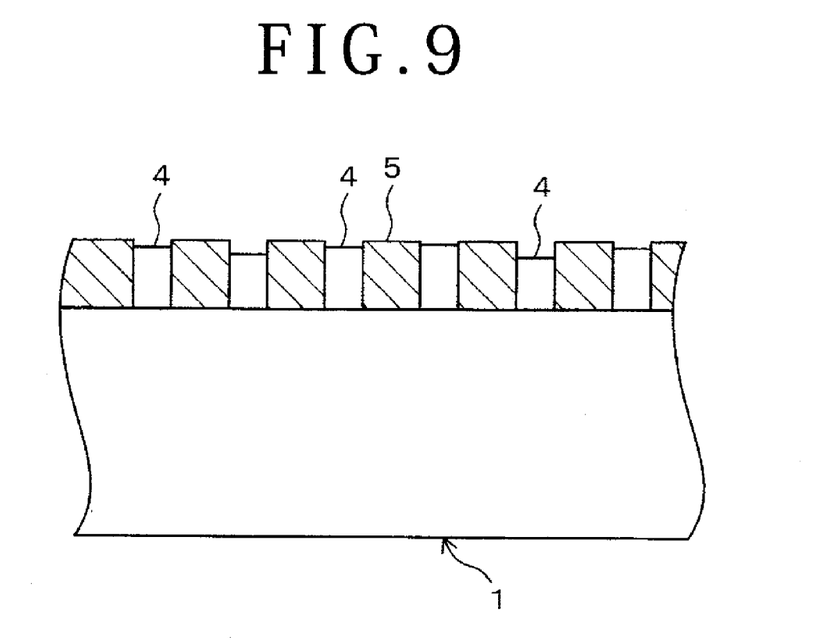
FIG. 9 is an enlarged sectional view of the face-side surface of a wafer after a first appendant part cutting step in a second embodiment.

FIG. 8A shows a wafer 1 similar to that shown in FIGS. 1A and 1B. First, the back-side surface of the wafer 1 is sucked directly onto a suction surface 22a of a chuck table 20 in the cutting apparatus 10 to hold the wafer 1, and only the surface of the resist layer 5 of an appendant part 6 is cut by a cutting unit 30 in such a range as not to reach the electrodes 4 (FIG. 8B). As a result, the surface of the appendant part 6 is in such a condition that the surface is composed of the flat resist layer 5 and that all the electrodes 4 having not been cut are buried below the surface of the resist layer 5, as shown in FIG. 9.

[3-2] Back-Side Surface Grinding Step

Figure 8C:
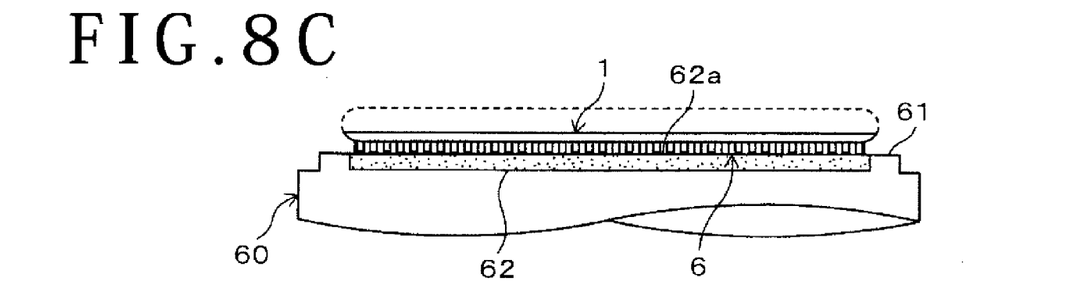

Next, as shown in FIG. 8C, the surface of the appendant part 6 cut as above is sucked directly onto a suction surface 62a of a chuck table 60 in the cutting apparatus 50 to hold the wafer 1, and the back-side surface of the wafer 1 is ground sequentially by grinding units 70A, 70B, whereby the wafer 1 is thinned until a desired thickness is attained.

[3-3] Second Appendant Part Cutting Step

Figure 8D:
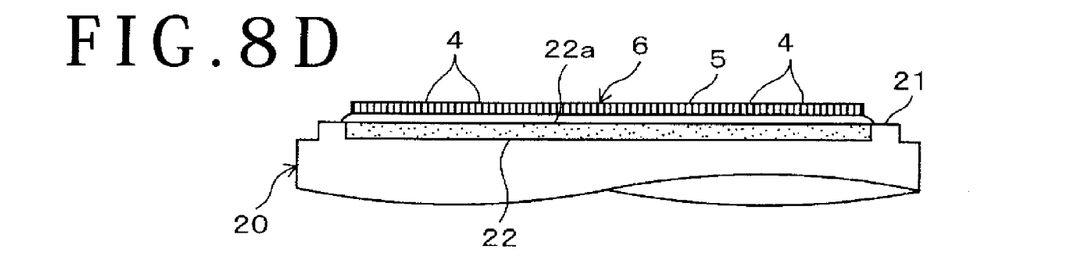
Figure 8E:
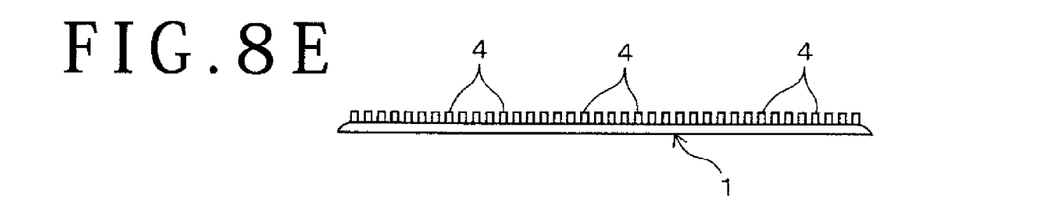

Subsequently, the wafer 1 is again set on the cutting apparatus, and the second appendant part cutting step is conducted. In this case, the ground back-side surface of the wafer 1 is sucked directly onto the suction surface 22a of the chuck table 20 to hold the wafer 1, and both the electrodes 4 and the resist layer 5 are cut by the cutting unit 30, whereby the electrodes 4 are adjusted to be uniform in height and the surface of the appendant part 6 is made flat (FIG. 8D). As a result, the surface of the appendant part 6 is in such a condition that the electrodes 4 and the resist layer 5 are flush with each other and that the electrodes 4 are adjusted to be uniform in height, as shown in FIG. 4.

[3-4] Resist Layer Removing Step

When the appendant part cutting step and the back-side surface grinding step as above are finished, the resist layer 5 is then removed by such means as etching, to obtain a wafer 1 having a plurality of electrodes 4 formed to protrude on the face side thereof, as shown in FIG. 8D. The wafer 1 is also in such a condition that the height of the wafer 1 and the heights of the electrodes 4 are uniform and that the total thickness is uniform.

According to the second embodiment, in the back-side surface grinding step, only the resist layer 5 of the appendant part 6 cut in the first appendant part cutting step is sucked onto the chuck table 60, so that the electrodes 4 are in the state of being protected by the resist layer 5, and do not make contact with the chuck table 60. Therefore, there is no possibility that the electrodes 4 might be damaged or stained during the back-side surface grinding. In addition, even when the tips of the electrodes 4 are stained in the back-side surface grinding step, the stained tips are cut in the second appendant part cutting step, so that the tips of the electrodes 4 in the wafer 1 obtained finally are in a sound state.

[4] Another Mode of Back-Side Surface Grinding Step

Figure 10:
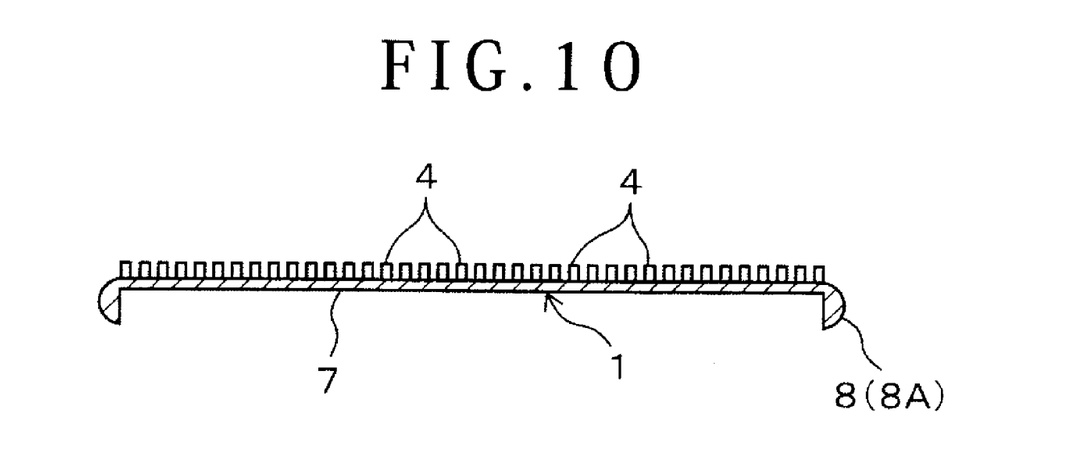
FIG. 10 is a sectional view of the wafer in which only that region of the back-side surface of the wafer which corresponds to a device formation region is cut.

While the whole area of the back-side surface of the wafer 1 is ground in the back-side grinding step in each of the above-mentioned embodiments, a mode may be adopted in which the whole surface is not ground, and, instead, only that region of the back-side surface which corresponds to the device formation region 7 is ground. This ensures that, as shown in FIG. 10, thinning is effected only in the device formation region 7, and an outer peripheral marginal region 8 surrounding the device formation region 7 is left in the original thickness, thereby newly forming an annular projected part 8A. According to such a wafer 1, the rigidity is secured by the annular projected part 8A, which is advantageous in that the wafer 1 thinned by the back-side grinding can be handled easily and can be prevented from being damaged. Incidentally, the grinding of only that region of the wafer back-side surface which corresponds to the device formation region 7 can be achieved by use of a grinding wheel of which the outer radius of grinding corresponds roughly to the radius of the wafer 1.

[5] Problems in the Prior Art

Finally, for making clear the effects of the present invention, a machining method according to the prior art will be briefly exemplified to show the problems involved therein.

Figure 11A:
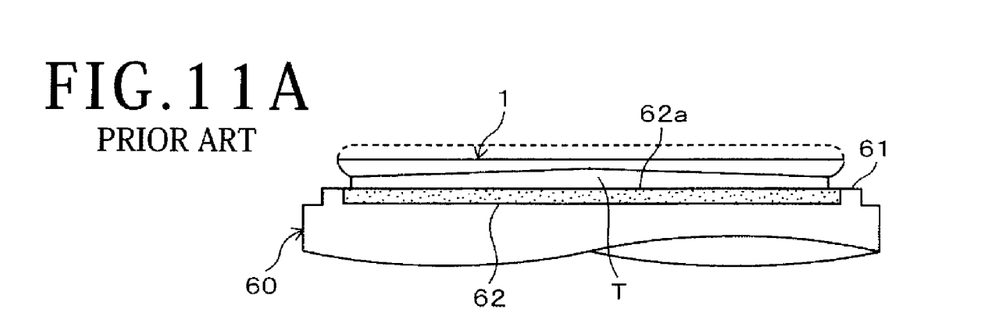
FIGS. 11A to 11D illustrate an example of a machining method according to the related art, in the order of steps.
Figure 11B:
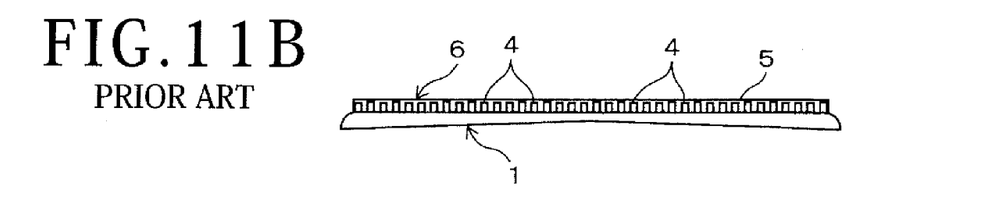
Figure 11C:
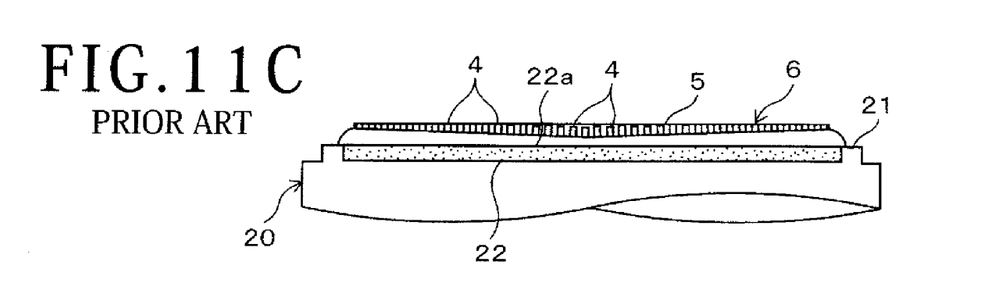
Figure 11D:
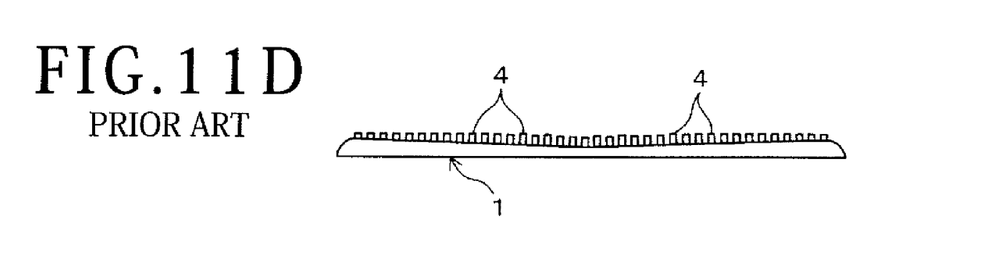

The machining method illustrated in FIGS. 11A to 11D is a method in which a wafer 1 is thinned by grinding the back-side surface thereof before forming electrodes 4. Specifically, a protective tape T is adhered to the face-side surface of the wafer 1 provided with semiconductor chips 2, the protective tape T on the face side is brought into secure contact with a suction surface 62a of a chuck table 60 in a grinding apparatus 50, and the back-side surface of the wafer 1 is ground (FIG. 11A). Next, the protective tape T is peeled, a resist layer 5 is formed on the face-side surface of the wafer 1, and a plurality of electrodes 4 are formed by plating (FIG. 11B). Subsequently, the surface of an appendant part 6 including the electrodes 4 and the resist layer 5 is flattened by cutting (FIG. 1C), and then the resist layer 5 is removed (FIG. 11D). Incidentally, the protective tape T is, for example, a tape in which one side of a soft resin-made base sheet of polyolefin or the like having a thickness of about 100 to 200 μm is coated with an adhesive in a thickness of about 10 μm, and the adhesive is brought into contact with the face-side surface of the wafer 1 at the time of adhering it.

According to this method, the protective tape T is adhered to the face-side surface of the wafer 1 in the back-side surface grinding step shown in FIG. 11A, for the purpose of protecting electronic circuits of semiconductor chips 2 or the like purpose. As has been above-mentioned, however, the machining load received at the time of grinding in infeed grinding is greater on the outer peripheral side (where the circumferential speed is higher) than on the inner peripheral side, so that the protective tape T is elastically deformed so as to be collapsed more on the outer peripheral side. As a result, the wafer 1 of which the back-side surface has been ground is thinner in the inner peripheral part and becomes thicker toward the outer peripheral side. Besides, in the case where the electrodes 4 are formed on the wafer 1 and the appendant part 6 is cut by holding the wafer 1 on the chuck table 60 as shown in FIG. 11C, the nonuniform thickness of the wafer 1 results in that, although the appendant part 6 seems flat, the electrodes 4 exposed upon removal of the resist layer 5 are nonuniform in height, and the total thickness of the wafer 1 is also nonuniform.

In addition, since the wafer 1 is thinned by grinding its back-side surface before forming the electrodes 4, there would be a problem, in the case where the desired thickness of the wafer 1 is comparatively small, that the wafer 1 may be warped in the step of forming the electrodes by plating after the thinning or that the wafer 1 may be broken in the subsequent step of cutting the appendant part 6.

Figure 12A:
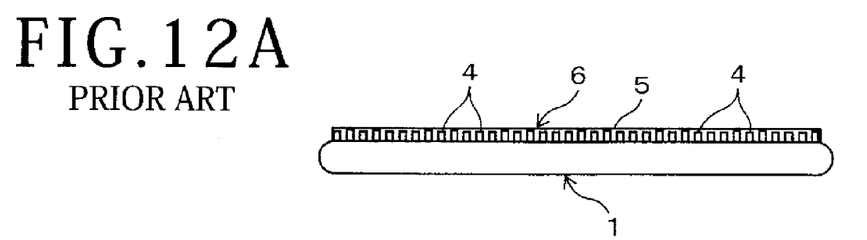
FIGS. 12A to 12E illustrate another example of the machining method according to the related art, in the order of steps.
Figure 12B:
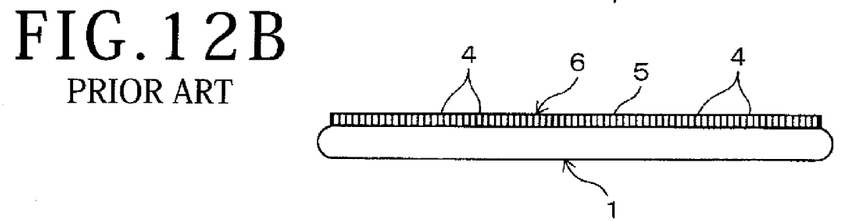
Figure 12C:
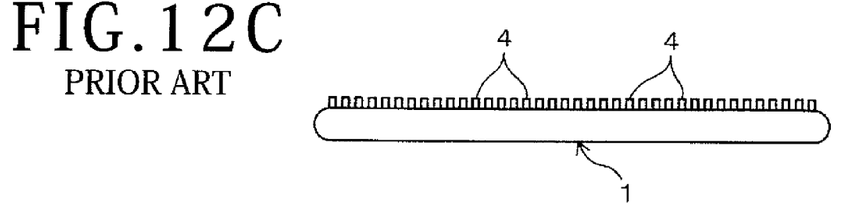
Figure 12D:
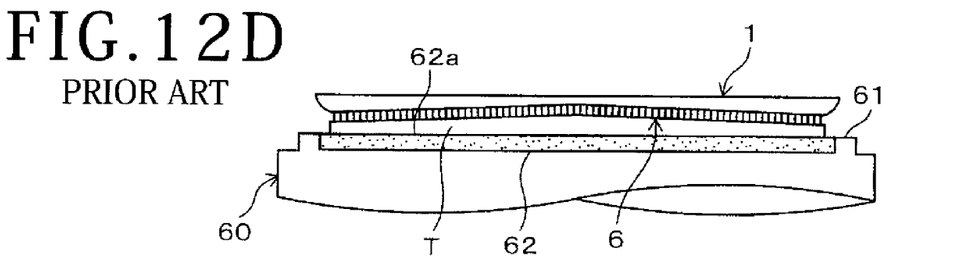
Figure 12E:
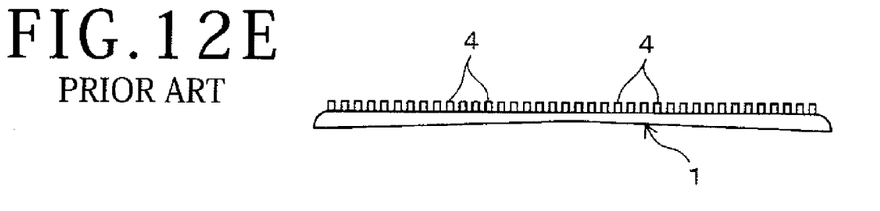

In the next place, the machining method illustrated in FIGS. 12A to 12E is a method in which the back-side surface of a wafer 1 is ground after formation of electrodes 4. At the time of the back-side surface grinding, a resist layer 5 has been removed, and, further, a protective tape T has been adhered to the face side of the wafer 1. In this method, the steps of FIGS. 12A and 12B are the same as in the first embodiment of the present invention described above, and the electrodes 4 and the resist layer 5 at the surface of the appendant part 6 of the wafer 1 are both cut, whereby both of them are made flush with each other and the electrodes 4 are adjusted to be uniform in height. Next, the resist layer 5 of the appendant part 6 is removed by such means as etching (FIG. 12C). Subsequently, a protective tape T is adhered to the face side of the wafer 1 to cover the electrodes 4, the protective tape T on the face side is brought into secure contact with a suction surface 62a of a chuck table 60 in a grinding apparatus 50, and the back-side surface of the wafer 1 is ground (FIG. 12D). Next, the protective tape T is peeled off (FIG. 12E).

In this method, the back-side surface grinding is conducted with the protective tape T adhered to the face side of the wafer 1, so that the thickness of the wafer 1 becomes nonuniform in the same manner as in the case of FIGS. 11A to 11D. Since the protective tape T is not used at the time of cutting the surface of the appendant part 6, the electrodes 4 become uniform in height, but the total thickness of the wafer 1 becomes nonuniform because the thickness of the wafer 1 is nonuniform, as shown in FIG. 12E. In this case, for preventing the electrodes 4 from being damaged through contact with the chuck table 60, the protective tape T adhered to the face side of the wafer 1 at the time of back-side surface grinding is selected to be one that is comparatively thick and rich in elasticity. Therefore, the amount of elastic deformation upon reception of a machining load during the back-side surface grinding is increased accordingly, leading to a conspicuous degree of dispersion of the thickness of the wafer 1.

According to the present invention, unlike the just-mentioned methods in the prior art, the protective tape for protecting the face side of the wafer at the time of back-side surface grinding is not used, and, instead, the wafer is directly mounted on and held by a chuck table. This ensures that in each wafer, the electrodes can be made uniform in thickness, and the total thickness of the wafer can be made uniform.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A method of machining a substrate provided at a face-side surface with an appendant part including a protruding metal formed to protrude from said face-side surface, and a resin part surrounding said protruding metal and having a height in excess of the protrusion amount of said protruding metal, said method comprising:
    a substrate holding step of holding said substrate by suction in the condition where the back side of said substrate is matched to a suction surface of a suction table;
    an appendant part cutting step of cutting a surface of said appendant part until the tip of said protruding metal and said resin part become at least flush with each other;
    a back-side surface grinding step of grinding a back-side surface of said substrate in the condition where said cut appendant part is sucked directly onto said suction surface of said suction table so as to hold said substrate; and
    a resin part removing step of removing said resin part from said face-side surface of said substrate.

2. The method of machining a substrate as set forth in claim 1, wherein said face-side surface of said substrate is provided with a device formation region and an outer peripheral marginal region surrounding said device formation region, and only that region of said back-side surface which corresponds to said device formation region is ground in said back-side surface grinding step.

3. A method of machining a substrate provided at a face-side surface with an appendant part including a protruding metal formed to protrude from said face-side surface, and a resin part surrounding said protruding metal and having a height in excess of the protrusion amount of said protruding metal, said method comprising:
    a substrate holding step of holding said substrate by suction in the condition where the back side of said substrate is matched to a suction surface of a suction table;
    a first appendant part cutting step of cutting only a surface of said resin part of said appendant part in such a range as not to reach said protruding metal;
    a back-side surface grinding step of grinding a back-side surface of said substrate in the condition where said cut resin part is sucked directly onto said suction surface of said suction table;
    a second appendant part cutting step of holding said substrate in the condition where said back-side surface of said substrate is sucked directly onto said suction surface of said suction table, and simultaneously cutting said protruding metal and said resin part until the tip of said protruding metal and said resin part become at least flush with each other; and
    a resin part removing step of removing said resin part from said face-side surface of said substrate.

4. The method of machining a substrate as set forth in claim 3, wherein said face-side surface of said substrate is provided with a device formation region and an outer peripheral marginal region surrounding said device formation region, and only that region of said back-side surface which corresponds to said device formation region is ground in said back-side surface grinding step.

* * * * *